United States Patent
Wang et al.

(10) Patent No.: US 7,633,813 B2
(45) Date of Patent: Dec. 15, 2009

(54) METHOD OF PERFORMING AN ERASE OPERATION IN A NON-VOLATILE MEMORY DEVICE

(75) Inventors: Jong-Hyun Wang, Cheongju-si (KR); Se-Chun Park, Seoul (KR); Seong-Hun Park, Gunsan-Si (KR)

(73) Assignee: Hynix Semiconductor Inc., Icheon-si (KR)

( * ) Notice: Subject to any disclaimer, the term of this patent is extended or adjusted under 35 U.S.C. 154(b) by 55 days.

(21) Appl. No.: 11/951,936

(22) Filed: Dec. 6, 2007

(65) Prior Publication Data
US 2008/0175069 A1 Jul. 24, 2008

(30) Foreign Application Priority Data
Jan. 23, 2007 (KR) ............ 10-2007-0007042
Aug. 8, 2007 (KR) ............ 10-2007-0079477

(51) Int. Cl.
*G11C 16/04* (2006.01)
(52) U.S. Cl. .................... 365/185.29; 365/185.11; 365/185.22; 365/185.24
(58) Field of Classification Search ............ 365/185.29, 365/185.11, 185.22, 185.24
See application file for complete search history.

(56) References Cited

U.S. PATENT DOCUMENTS
7,050,336 B2    5/2006  Tomoeda et al.

FOREIGN PATENT DOCUMENTS
JP    2005-085309       3/2005
KR    1020020036273 A   5/2002
KR    1020020048259 A   6/2002

*Primary Examiner*—David Lam
(74) *Attorney, Agent, or Firm*—Townsend and Townsend and Crew LLP

(57) ABSTRACT

An erase method of a memory cell array which includes at least one block having MLC is disclosed. The erase method includes shifting every threshold voltage distribution into a threshold voltage distribution having a highest level by pre-programming every cell in a block selected for erase, performing an erase operation on the pre-programmed memory block, performing a soft program and a verifying operation on the memory block, dividing the memory block into a first group and a second group when the memory block is passed, performing a verifying operation on the first group and performing a soft program and a verifying operation on the first group when the first group is not passed, and performing a verifying operation on the second group when the first group is passed and performing a soft program and a verifying operation on the second group when the second group is not passed.

17 Claims, 9 Drawing Sheets

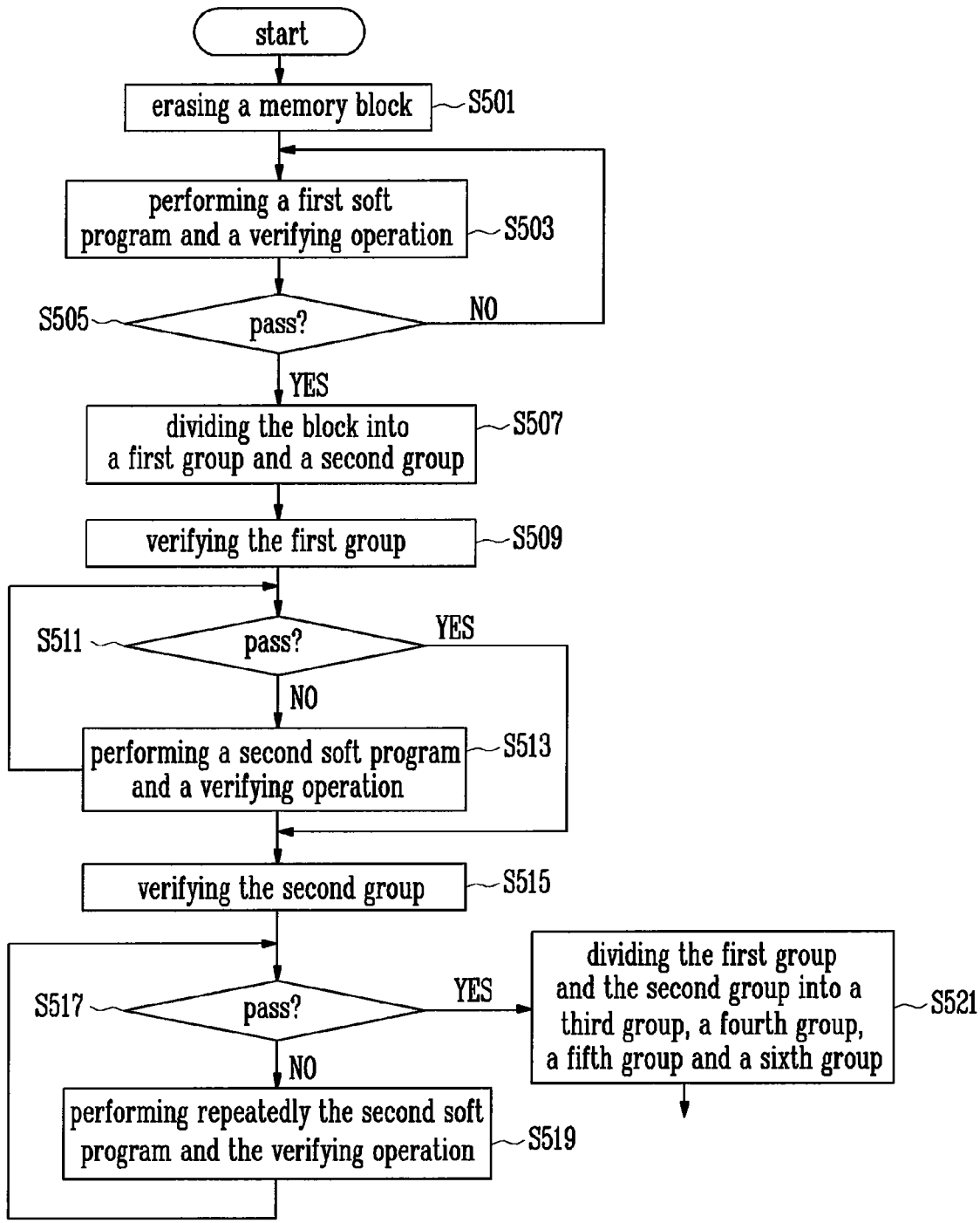

METHOD OF PERFORMING AN ERASE OPERATION IN A NON-VOLATILE MEMORY DEVICE

CROSS-REFERENCE TO RELATED APPLICATIONS

This application claims priorities from Korean Patent Application No. 2007-7042 filed on Jan. 23, 2007, and Korean Patent Application No. 2007-79477 filed on Aug. 8, 2007, the contents of which are incorporated herein by reference in its entirety.

BACKGROUND OF THE INVENTION

The present invention relates to an erase operation in a non-volatile memory device. More particularly, the present invention relates to a method of performing an erase operation in a non-volatile memory device for enhancing threshold voltage distribution characteristic after an erase operation is performed in a memory device having multi level cell MLC.

Recently, multi bit cells for storing a plurality of data in one memory cell has been actively studied so as to enhance the degree of integration of a flash memory. This memory cell is referred to as a multi level cell MLC. A memory cell for storing one data bit is referred to as a single level cell SLC.

The MLC has a plurality of threshold voltage distributions so as to store a plurality of data. This means that data are differently stored depending on the threshold voltage distributions.

Hereinafter, an erase operation in accordance with the threshold voltage distributions will be described in detail.

Firstly, a pre-program process is performed so as to shift the threshold voltage distributions into the threshold voltage distribution having highest level.

FIG. 1A is a view illustrating a process of applying a voltage in a pre-program for erase of a non-volatile memory device.

In FIG. 1A, to perform the pre-program, a program voltage Vpgm is applied to word lines WL of every cell, a power supply voltage VDD is provided to a drain select line DSL related to a drain select transistor DST, and a voltage of 0V is applied to a source select line SSL related to a source select transistor SST. In addition, a program operation is performed in a unit of a block by applying the power supply voltage VDD to a common ground line after providing a voltage of 0V to a substrate. Here, one block has a plurality of word lines WL, and a non-volatile memory device includes generally a memory cell array (not shown) having blocks.

FIG. 1A illustrates only a part of cell strings so as to show a process of applying a voltage in the pre-program.

In case that the program operation is performed by applying the voltages as described above, threshold voltage distributions of every memory cell are shifted into the threshold voltage distribution having highest level.

Subsequently, an erase operation is performed on the memory cells after the threshold voltage distributions are shifted into the threshold voltage distribution having highest level.

FIG. 1B is a view illustrating a process of applying a voltage for erase of the non-volatile memory device.

In FIG. 1B, to perform the erase operation, the DSL and SSL are converted into a floating state, and a voltage of 0V is applied to every word line WL. Then, a high voltage of 20V is applied to the substrate. As a result, data of every cell in a corresponding block are erased, and threshold voltage of a corresponding memory cell is downed to a voltage of below 0V. Here, in case that the memory cell is over-erased in accordance with its characteristics, a problem exists in that the threshold voltage of the memory cell is downed to a voltage smaller than desired threshold voltage.

To compensate above problem, a soft program is performed.

FIG. 1C is a view illustrating a process of applying a voltage in the soft program for erase of the non-volatile memory device.

In FIG. 1C, to perform the soft program, a voltage of 0V is applied to the substrate, and the power supply voltage VDD and a voltage of 0V are provided to the DSL and the SSL, respectively. Then, a program operation is performed by applying the program voltage Vpgm to every word line WL so that the over-downed threshold voltage is changed to a voltage of below 0V but is not too low, i.e. the memory cell has the threshold voltage distribution having desired narrow width. Here, the program voltage Vpgm is set so that the memory cells are not programmed to a voltage of above 0V.

Hereinafter, a verifying operation performed after the soft program is finished will be described with reference to accompanying drawing FIG. 1C.

FIG. 1D is a view illustrating a process of applying a voltage for the verifying operation after the soft program in FIG. 1C.

In FIG. 1D, the verifying operation is performed column by column in a unit of a block. Particularly, a read operation is performed by applying the power supply voltage VDD to the DSL and SSL in each of the columns, and applying a voltage of 0V to every word line WL. Here, it is discriminated through the read operation whether or not the soft program is normally performed. On the other hand, in case that at least one memory cell is passed on the verifying voltage, it is discriminated that whole columns related to the memory cell are passed.

In case that the erase operation is performed on the MLC through a method described above, a threshold voltage distribution is not narrowed when the erase operation is finished because the verifying operation is performed in a unit of a column after erasing the memory cell in a unit of a block. As a result, a memory cell having the threshold voltage distribution affects to its surrounding memory cell through interference effect when the program operation on the surrounding memory cell is performed. Accordingly, the threshold voltage distribution becomes wholly wide.

To solve this problem, the verifying operation may be performed bit by bit. However, in this case, a time required for the verifying operation is increased, and so efficiency of the erase operation may be lowered.

SUMMARY OF THE INVENTION

It is a feature of the present invention to provide a method of performing an erase operation in a non-volatile memory device for making a threshold voltage distribution narrow, thereby reducing interference between threshold voltage distributions. As a result, efficiency of the memory device may be enhanced.

An erase method in a non-volatile memory device having a memory cell array which includes at least one blocks having multi level cells according to one example embodiment of the present invention includes shifting every threshold voltage distribution into a threshold voltage distribution having highest level by pre-programming every cell in a block selected for erase; performing an erase operation on the pre-programmed memory block; performing a soft program and a verifying operation on the memory block; dividing the memory block into a first group and a second group in case that the memory block is passed in accordance with the verifying result; performing a verifying operation on the first group, and performing a soft program and a verifying operation on the first group in case that the first group is not passed; and performing a verifying operation on the second group in case that the first group is passed, and performing a soft program and a verifying operation on the second group in case that the second group is not passed in accordance with the verifying result.

An erase method in a non-volatile memory device having a memory cell array which includes at least one blocks having multi level cells according to another example embodiment of the present invention includes shifting every threshold voltage distribution into a threshold voltage distribution having highest level by pre-programming every cell in a block selected for erase; performing an erase operation on the pre-programmed memory block; performing a soft program and a verifying operation on the memory block; dividing the memory block into a first group and a second group in case that the memory block is passed in accordance with the verifying result; performing a verifying operation on the first group and the second group, and indicating a flag to a group not passed; and performing a soft program and a verifying operation on the group to which the flag is indicated.

A method of performing an erase operation in a nonvolatile memory device according to another example embodiment of the present invention includes performing an erase operation on an area of the memory device, performing a first soft program operation on the area of the memory device, dividing the area of he memory device into a first group and second group, and performing a second soft program operation on the first group and a third soft program operation on the second group.

The soft program operation includes applying a program voltage to a selected word line, and applying a verify voltage to the selected word line.

As described above, a method of performing an erase operation in a non-volatile memory device of the present invention makes threshold voltage distribution of a memory cell narrow after an erase operation of a MLC is performed, thereby reducing interference between threshold voltage distributions when a program operation is performed. As a result, efficiency of the memory device may be enhanced.

BRIEF DESCRIPTION OF THE DRAWINGS

The above and other features and advantages of the present invention will become readily apparent by reference to the following detailed description when considered in conjunction with the accompanying drawings wherein:

FIG. 5A and FIG. 5B are flow charts illustrating a soft program method according to a first example embodiment of the present invention.

DESCRIPTION OF SPECIFIC EMBODIMENTS

Hereinafter, the preferred embodiments of the present invention will be explained in more detail with reference to the accompanying drawings.

Figure 1A:
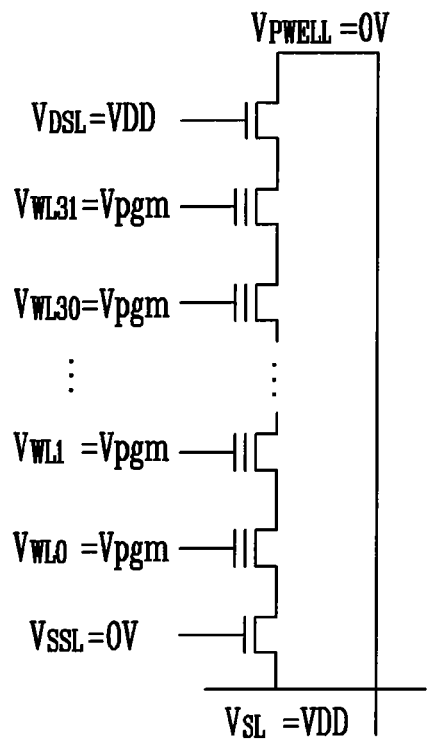
FIG. 1A is a block diagram illustrating a common light emitting device.
Figure 1B:
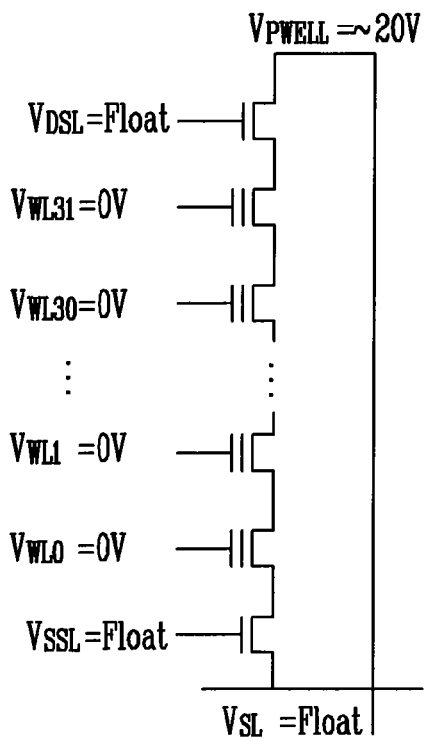
FIG. 1B is a view illustrating a process of applying a voltage for erase of the non-volatile memory device.
Figure 1C:
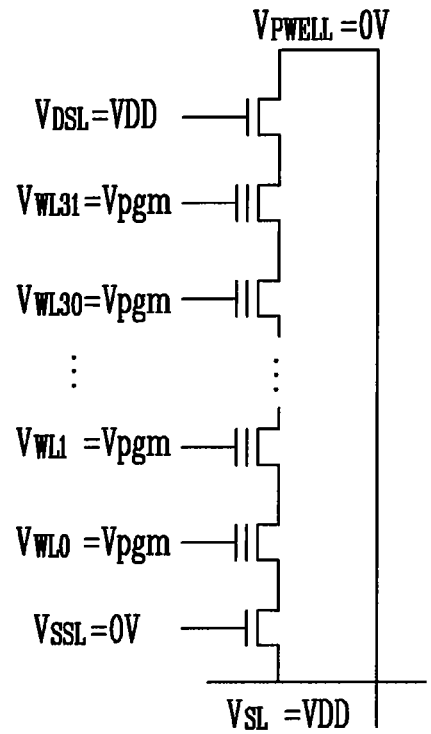
FIG. 1C is a view illustrating a process of applying a voltage in the soft program for erase of the non-volatile memory device.
Figure 1D:
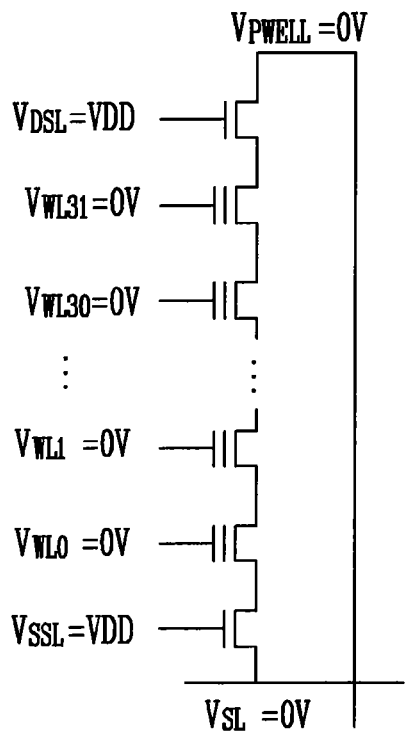
FIG. 1D is a view illustrating a process of applying a voltage for the verifying operation after the soft program in FIG. 1C.
Figure 2A:
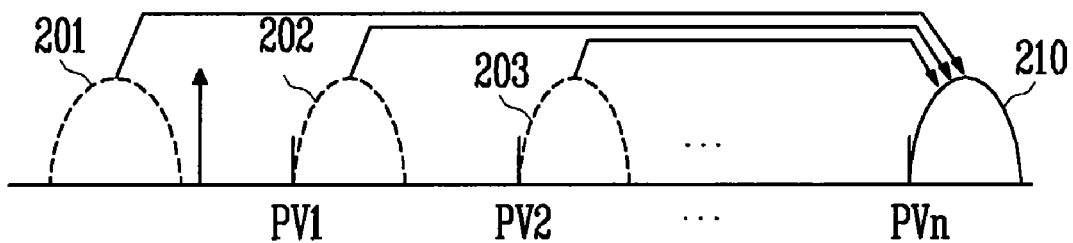
FIG. 2A is a view illustrating shift of threshold voltage distribution of a memory cell in accordance with a pre-program for an erase operation of a non-volatile memory device.
Figure 2B:
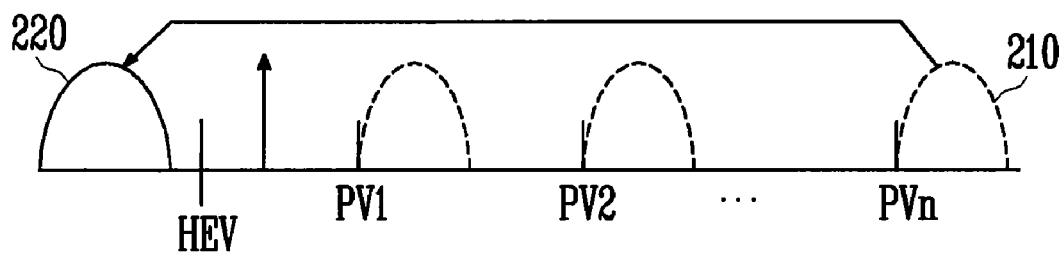
FIG. 2B is a view illustrating shift of the threshold voltage distribution in accordance with the erase operation after the pre-program in FIG. 2A.
Figure 2C:
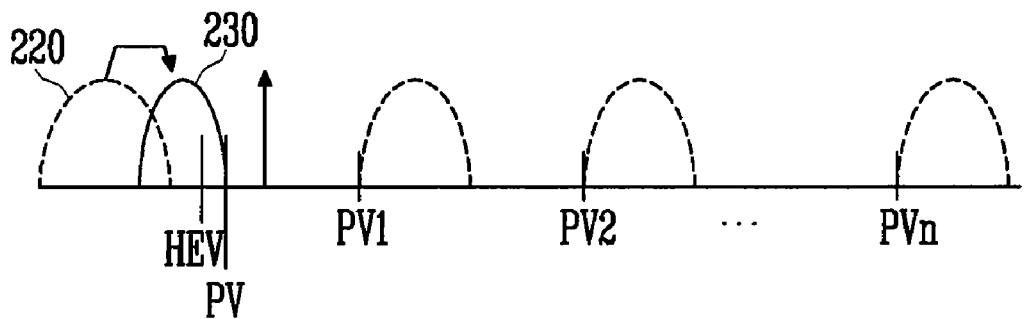
FIG. 2C is a view illustrating shift of the threshold voltage distribution in accordance with operation of a soft program after the erase operation in FIG. 2B.

FIG. 2A is a view illustrating shift of threshold voltage distribution of a memory cell in accordance with a pre-program for an erase operation of a non-volatile memory device. FIG. 2B is a view illustrating shift of the threshold voltage distribution in accordance with the erase operation after the pre-program in FIG. 2A. FIG. 2C is a view illustrating shift of the threshold voltage distribution in accordance with operation of a soft program after the erase operation in FIG. 2B.

In FIG. 2A, a multi level cell (hereinafter, referred to as "MLC") has a plurality of threshold voltage distributions 201 to 210 in accordance with program state. Hence, to perform an erase operation, a pre-program is performed so as to shift the threshold voltage distributions 201 to 203 into the threshold voltage distribution 210 having highest level.

The pre-program is performed in a unit of a block, wherein the block is included in a memory cell array (not shown) of a non-volatile memory device. Particularly, a program operation Vpgm is applied to every word line WL, and a power supply voltage VDD is provided to a drain select line DSL. In addition, a voltage of 0V is applied to a source select line SSL, and then a program operation is performed.

Accordingly, in case that the pre-program is finished, every threshold voltage distribution 201 to 203 is shifted into the threshold voltage distribution 210 having highest level.

Then, an erase operation is performed on the threshold voltage distribution 210 related to the shifting.

FIG. 2B shows threshold voltage distributions changed in accordance with the erase operation.

In FIG. 2B, in case that the erase operation is performed on the threshold voltage distribution 210, every cell shifted into the threshold voltage distribution 210 is erased to a voltage of 0V and is shifted into a threshold voltage distribution 220. Particularly, the erase operation is performed in a unit of a block, and is performed by floating the DSL and the SSL after applying a voltage of 0V to every word line WL. The threshold voltage distributions of memory cells on which the erase operation is performed are shifted into a voltage less than a reference voltage HEV.

Then, a soft program is performed so as to compensate the memory cells shifted into the voltage less than the reference voltage HEV, thereby shifting the threshold voltage distribution 220 into a threshold voltage distribution 230 having narrow width as shown in FIG. 2C.

In FIG. 2C, the memory cells erased to the voltage less than the reference voltage HEV are over-erased cells. Accordingly, the threshold voltage distribution 220 of the memory cells are shifted into the threshold voltage distribution 230 having narrow width by using the soft program and the verifying voltage Pv.

Hereinafter, a method of shifting the threshold voltage distribution 220 into the threshold voltage distribution 230 will be described in detail.

Figure 3:
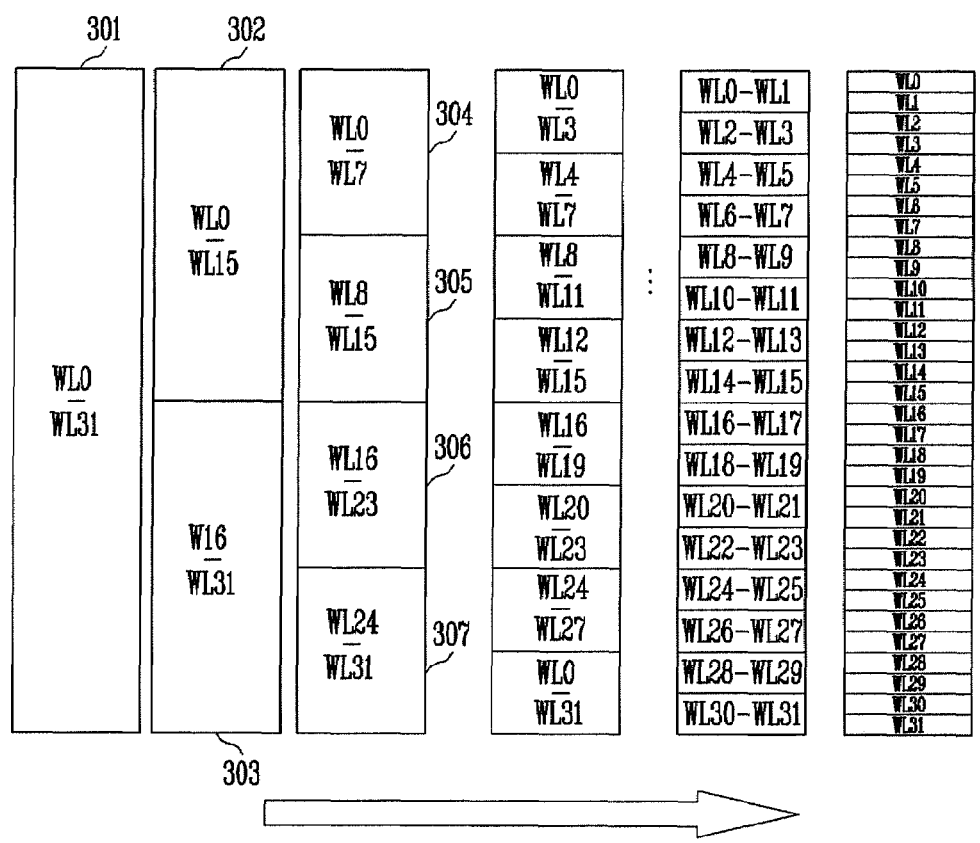
FIG. 3 is a block diagram illustrating a soft program operation according to one example embodiment of the present invention.

FIG. 3 is a block diagram illustrating a soft program according to one example embodiment of the present invention.

In FIG. 3, the soft program of the present embodiment is performed on every memory block 301, and then a verifying operation for verifying the soft program is performed through a column scan method.

In case that it is verified that every memory block 301 on which the soft program is performed is passed, the memory block 301 is divided into a first group 302 and a second group 303. In one example embodiment of the present invention, the first group 302 includes word lines WL0 to WL15, and the second group 303 has word lines WL16 to WL31. Here, it is discriminated that the soft program of whole columns related to memory cells are passed in case that at least one memory cell is passed by a verifying voltage.

A verifying operation is performed on the groups 302 and 303, and then the soft program is again performed on the group not passed. Here, the verifying operation uses a column method, but a pass voltage is applied to the word lines included in the group not selected so that the group not selected are not affected by the soft program.

That is, in case that it is verified that the first group 302 is not passed, the soft program is repeatedly performed until the first group 302 is passed.

In case that it is verified that the first group 302 is passed, the verifying operation is performed on the second group 303, and then the soft program is again performed in case that it is verified that the second group 303 is not passed.

In another example embodiment of the present invention, the verifying operation is performed in sequence on the first group 302 and the second group 303, and then a flag is indicated to the group not passed. Subsequently, in case that the verifying on the groups 302 and 303 is finished, the soft program is again performed on the group to which the flag is indicated.

In case that the soft program on the groups 302 and 303 is finished, the first group 302 is divided into a third group 304 and a fourth group 305, and the second group 303 is divided into a fifth group 306 and a sixth group 307.

In one example embodiment of the present invention, the third group 304 includes the word lines WL0 to WL7, and the fourth group 305 has the word lines WL8 to WL15. In addition, the fifth group 306 includes the word lines WL16 to WL23, and the sixth group 307 has the word lines WL24 to WL31.

The verifying operation is performed on the third to sixth groups 304 to 307, and then the soft program is repeatedly performed until the third to sixth groups 304 to 307 is passed.

In another example embodiment of the present invention, the verifying operation is performed on the groups 304 to 307, and then a flag is indicated to the group not passed. Subsequently, in case that the verifying on the groups 304 to 307 is finished, the soft program is again performed on the group to which the flag is indicated.

In FIG. 3, the above group division uses a method of halving the word lines for convenience of description.

In addition, when the soft program and the verifying operation are performed, memory cells corresponding to the word lines not selected are not programmed so that the memory cells do not affect to the verifying operation.

Figure 4A:
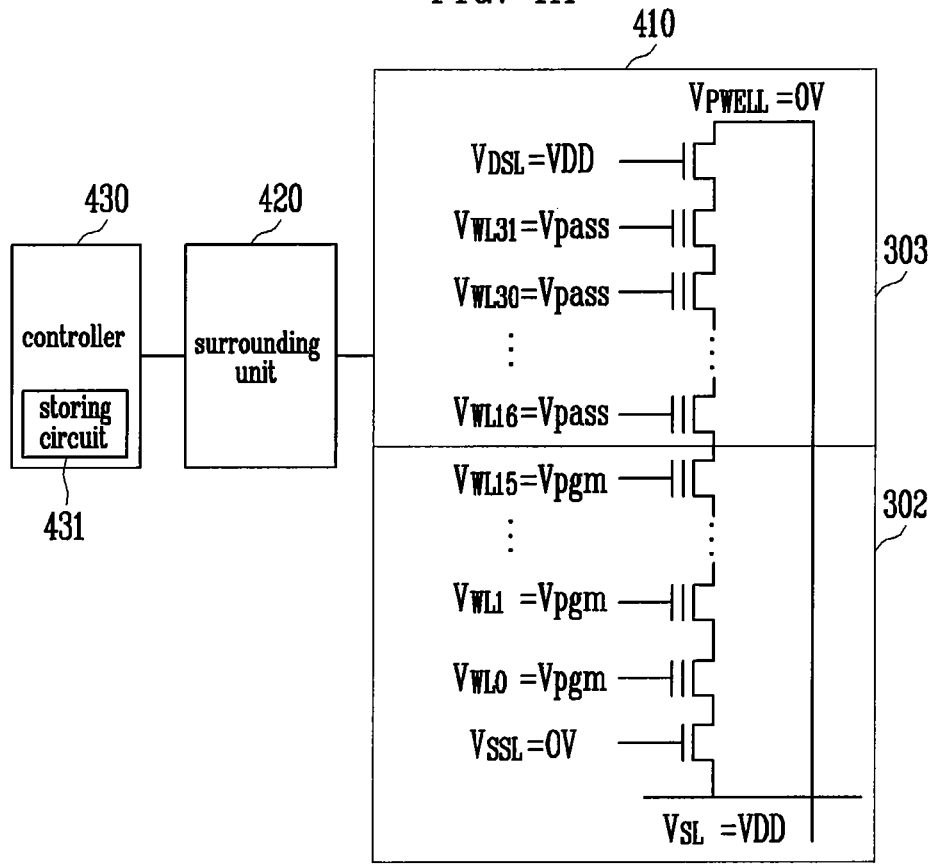
FIG. 4A is a view illustrating a process of applying a voltage in the soft program according to one example embodiment of the present invention.

FIG. 4A is a view illustrating a process of applying a voltage in the soft program according to one example embodiment of the present invention.

In FIG. 4A, a flash memory device of the present embodiment includes a memory cell array 410 having memory cells, a surrounding circuit coupled to the memory cell array 410 and for performing a program operation, an erase operation or a read operation, etc and a controller 430 for controlling the surrounding circuit 420.

The memory cell array 410 includes a plurality of cell strings having memory cells coupled in serial between a drain select transistor DST and a source select transistor SST, wherein each of the cell strings is coupled to a bit line.

Gates of the drain select transistors DST are coupled in common to the drain select line DSL, and gates of the source select transistors SST are coupled in common to the source select line SSL.

Gates of the memory cells are coupled to the word lines WL0 to WL31. In one example embodiment of the present invention, the word lines WL0 to WL15 are included in the first group 302 and the word lines WL16 to WL31 are included in the second group 303 as shown in FIG. 3.

The surrounding circuit 420 stores data in the memory cell array 410 or reads data from the memory cell array 410, and includes a page buffer, an X decoder and Y decoder, etc.

The controller 430 outputs a control signal for controlling operation of the surrounding circuit 420, and has a storing circuit 431 for storing flag information in accordance with program state or erase state.

In FIG. 4, a soft program is performed on the first group 302. Particularly, a program voltage Vpgm is applied to the word lines WL0 to WL15 selected for the soft program, and a pass voltage Vpass is provided to the word lines WL16 to WL31 not selected. Hence, memory cells related to the word lines WL16 to WL31 not selected are not programmed, and so the memory cells do not affect to the soft program.

Hereinafter, a verifying operation of verifying the soft program will be described in detail.

Figure 4B:
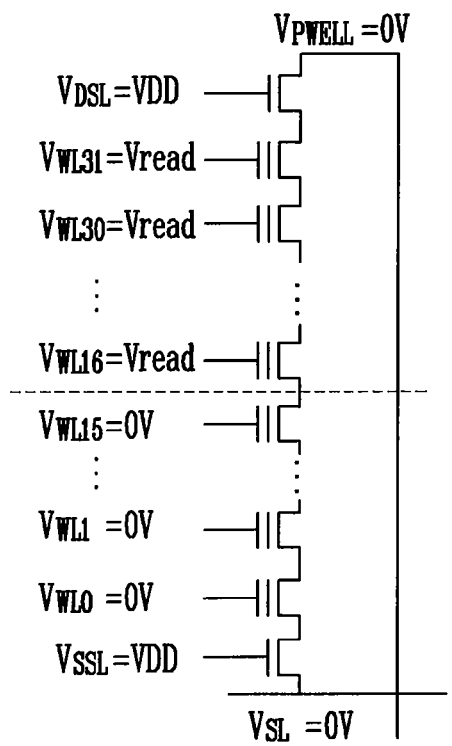
FIG. 4B is a view illustrating a process of applying a voltage in the verifying operation performed after the soft program in FIG. 4A.

FIG. 4B is a view illustrating a process of applying a voltage in the verifying operation performed after the soft program in FIG. 4A.

In FIG. 4B, a voltage of 0V is applied to the word lines WL0 to WL15 selected for the soft program, and a read voltage Vread is provided to the word lines WL16 to WL31 not selected so that the word lines WL16 to WL31 do not affect to the verifying result.

An erased cell having narrow threshold voltage distribution is generated by the soft program of the present embodiment.

As the soft program is progressed, the more the word lines on which the soft program is performed are passed through the verifying operation. As a result, applying number of the program voltage Vpgm is reduced according as the soft program is progressed, and so width of whole threshold voltage distribution is narrowed.

Hereinafter, two soft program methods mentioned above will be described in detail.

Figure 5B:
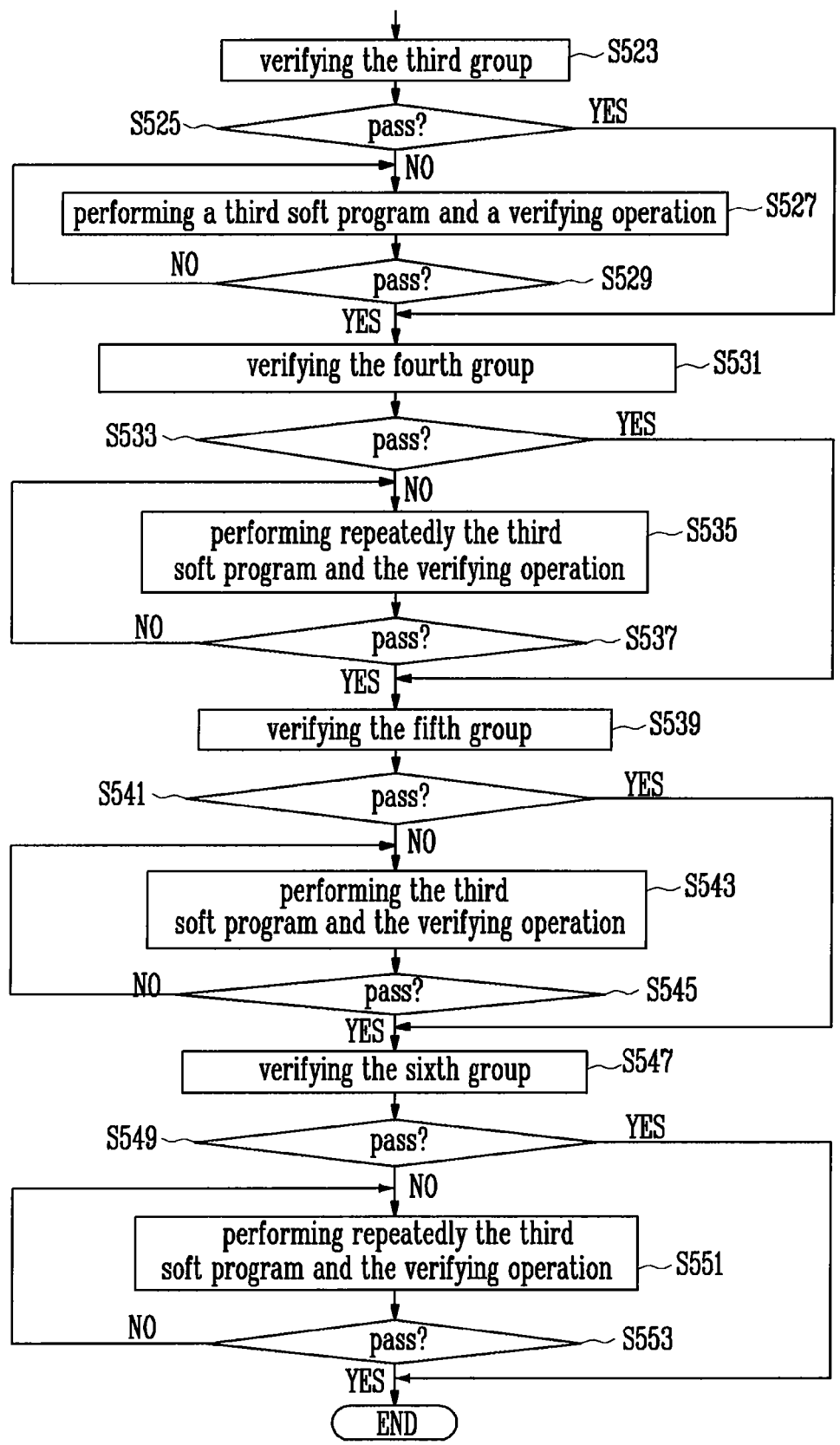

FIG. 5A and FIG. 5B are flow charts illustrating a soft program method according to a first example embodiment of the present invention. Here, FIG. 5B follows FIG. 5A. Additionally, the soft program is performed as shown in FIG. 4A, and the verifying operation is performed as shown in FIG. 4B.

In FIG. 5A, an erase operation is performed on whole memory blocks in step S501, and then the first soft program and a verifying operation are performed on every memory block in steps S503 and S505. Here, the first soft program is repeatedly performed until whole memory blocks are passed.

In case that the first soft program and the verifying operation are finished, memory block is divided into a first group and a second group in step S507.

In steps S509 and S511, a verifying operation is performed on the first group, and then it is discriminated whether or not the first group is passed through the verifying result.

In steps S513 and S511, in case that the first group is not passed, a second soft program is repeatedly performed until the first group is passed.

In step S515, in case that the first group is passed, a verifying operation is performed on the second group.

The first group and the second group are divided as shown in FIG. 3.

In steps S517 and S519, the second soft program and the verifying operation are repeatedly performed until the second group is passed.

In step S521, in case that the first group and the second group are passed through the verifying result, the first group is divided into a third group and a fourth group, and the second group is divided into a fifth group and a sixth group.

Hereinafter, a soft program on the third group to the sixth group will be described with reference to accompanying drawing FIG. 5B.

In FIG. 5B, a verifying operation is performed on the third group in step S523.

In case that the third group is passed through the verifying result in step S525, a verifying operation is performed on the fourth group in step S531.

However, in case that the third group is not passed, a third soft program and a verifying operation on the third soft program are performed in step S527. Here, the step S527 is repeatedly performed until the third group is passed in steps S529 and S527.

In case that the third group is passed, a verifying operation is performed on the fourth group in step S531.

In case that the fourth group is gassed through the verifying result in step S533, a verifying operation is performed on the fifth group in step S539. However, in case that the fourth group is not passed, a third soft program and a verifying operation on the third soft program are performed in step S535. Here, the step S535 is repeatedly performed until the third group is passed in steps S537 and S535.

In case that the fifth group is passed through the verifying result in step S541, a verifying operation is performed on the sixth group in step S547. However, in case that the fifth group is not passed, a third soft program and a verifying operation on the third soft program are performed in step S543. Here, the step S543 is repeatedly performed until the third group is passed in steps S545 and S543.

In case that the fifth group is passed through the verifying result in step S541, a verifying operation is performed on the sixth group in step S547. However, in case that the sixth group is not passed at step 549, a third soft program and a verifying operation on the third soft program are performed in step S551. Here, the step S551 is repeatedly performed until the third group is passed in steps S553 and S551.

In brief, the memory block is divided into the first group and the second group, and then the second soft program is repeatedly performed until the first group and the second group are passed through the verifying result. Subsequently, the third soft program is repeatedly performed until the third group to the sixth group divided from the first group and the second group are passed. That is, the verifying operation is performed on each of the groups, and then it is discriminated whether or not the groups are passed. The, the corresponding soft program is performed on the group not passed.

Figure 6A:
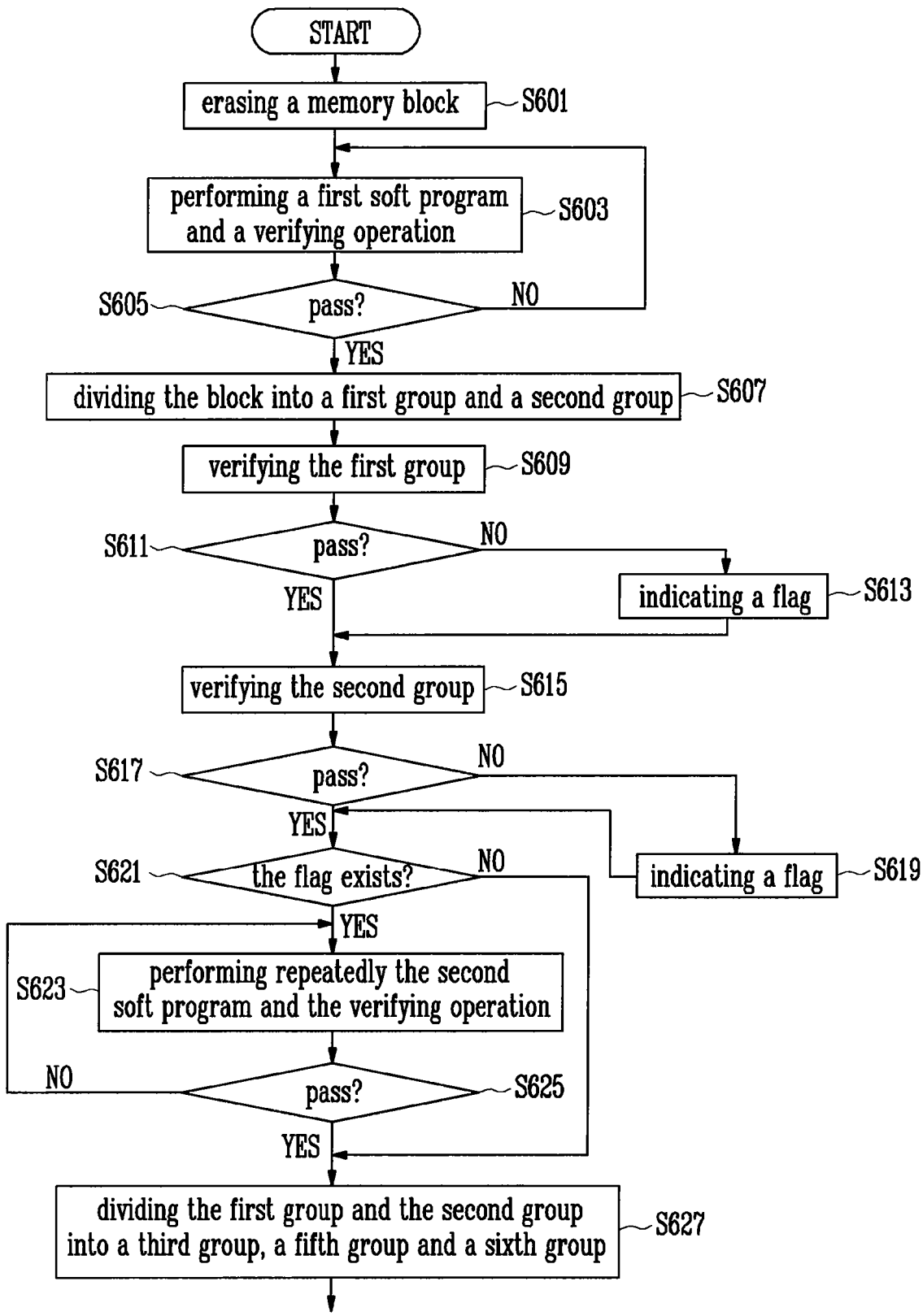
FIG. 6A and FIG. 6B are flow charts illustrating a soft program method according to a second example embodiment of the present invention.
Figure 6B:
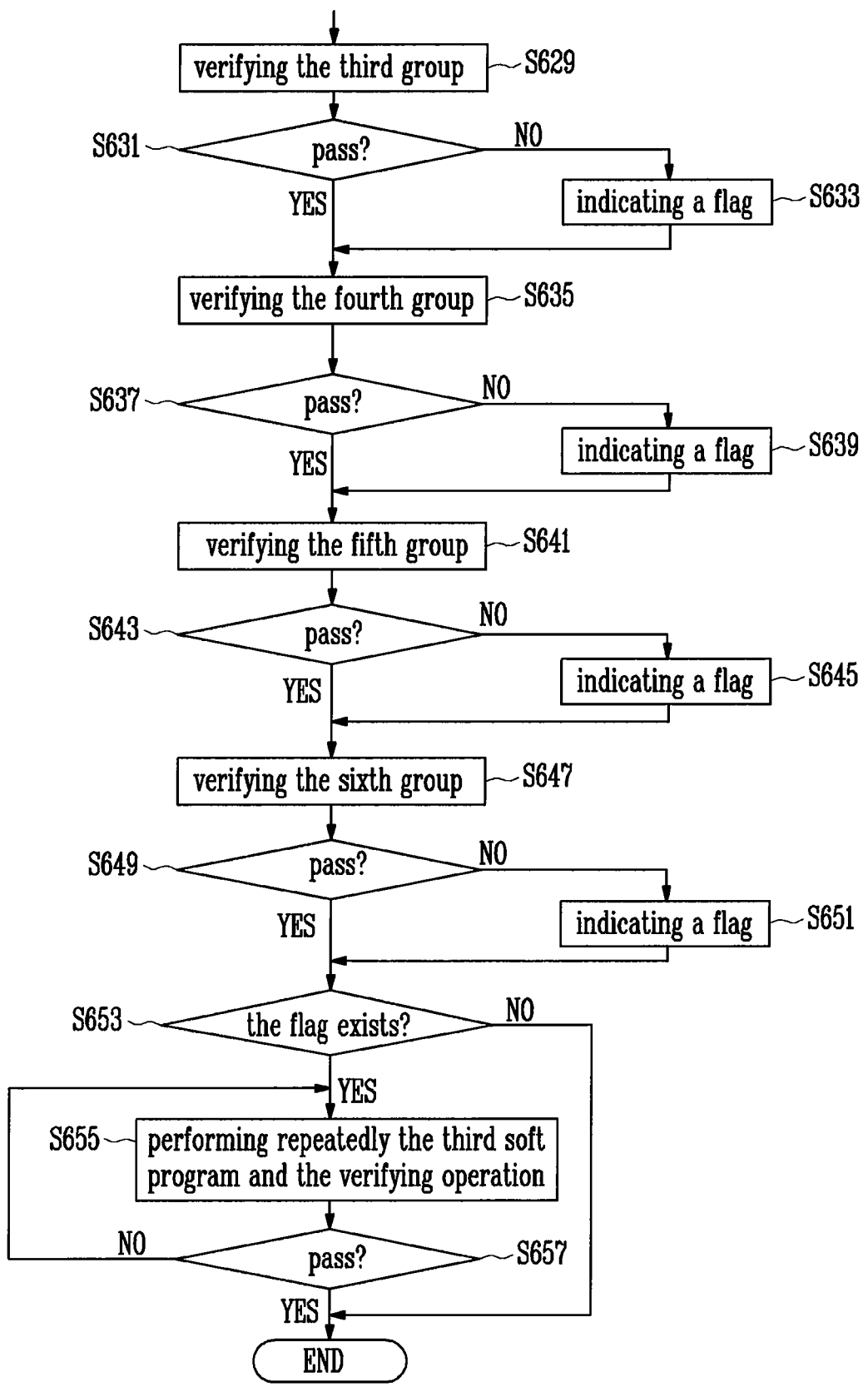

FIG. 6A and FIG. 6B are flow charts illustrating a soft program method according to a second example embodiment of the present invention. Here, the soft program is performed as shown in FIG. 4A, and the verifying operation is performed as shown in FIG. 4B.

In FIG. 6A, to perform the soft program method of the present embodiment, an erase operation is performed on whole memory blocks in step S601, and then a first soft program and a verifying operation on the first soft program are performed on every memory block in steps S603 and S605. Here, the first soft program is repeatedly performed until every memory block is passed.

In step S607, in case that every memory block is passed through the verifying result, the memory block is divided into the first group and the second group. Here, the first group and the second group are divided as shown in FIG. 3.

Subsequently, the first group is verified in step S609, and then the second group is verified in case that the first group is passed in step S613.

However, in case that the first group is not passed, a flag is indicated to the first group in step S613. Here, the flag indication is stored in a storing means for storing flag or is stored in the storing means 431 in the controller 430.

In case that the verifying on the first group is finished, the second group is verified in step S615.

However, in case that the first group is not passed in step S617, the flag is indicated to the first group in step S619.

In case that the verifying on the first group and the second group is finished, it is verified whether or not the group to which the flag is indicated exists in step S621.

In case that the group to which the flag is indicated exists, a second soft program and a verifying operation on the second soft program are performed so that the group is passed in steps S623 and S625. In this case, the controller 430 resets the flag of the group passed in accordance with the verifying result on the second soft program.

In case that the first group and the second group are passed, the first group is divided into the third group and the fourth group, and the second group is divided into the fifth group and the sixth group in step S627. Here, in one example embodiment of the present invention, the third group includes the word lines WL0 to WL7, and the fourth group has the word lines WL9 to WL16. In addition, the fifth group includes the word lines WL17 to WL24, and the sixth group has the word lines WL25 to WL31.

Hereinafter, a soft program on the third group to the sixth group is performed as shown in FIG. 6B.

In FIG. 6B, a verifying operation is performed on the third group in step S629.

In case that the third group is not passed in accordance with the verifying result in step S631, a flag is indicated to the third group in step S633.

Subsequently, a verifying operation is performed on the fourth group, the fifth group and the sixth group, and then a flag is indicated to the group not passed in steps S635 to S651.

In case that the verifying operation on the third group to the sixth group is finished, it is verified whether or not the group to which the flag is indicated exists in step S653.

In case that the group to which the flag is indicated exists, the third soft program is performed on the group to which the flag is indicated and then the verifying operation on the third soft program is performed in steps S655 and S657.

The group passed in accordance with the third soft program releases the flag indication.

In case that the third group to the sixth group are passed, the soft program is finished.

In FIG. 5A, FIG. 5B, FIG. 6A and FIG. 6B, the soft program is performed on the first group to the sixth group. However, the third group to the sixth group may be divided into low rank groups, and a soft program may be performed on the low rank groups.

The soft program method of the first embodiment or the soft program method of the second embodiment may be performed on the low rank groups.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of performing an erase operation in a nonvolatile memory device having a memory cell array which includes at least one blocks having multi level cells, the method comprising:
    shifting every threshold voltage distribution into a threshold voltage distribution having highest level by preprogramming every cell in a block selected for erase;
    performing an erase operation on the pre-programmed memory block;
    performing a soft program and a verifying operation on the memory block;
    dividing the memory block into a first group and a second group in case that the memory block is passed in accordance with the verifying result;
    performing a verifying operation on the first group, and performing a soft program and a verifying operation on the first group in case that the first group is not passed; and
    performing a verifying operation on the second group in case that the first group is passed, and performing a soft program and a verifying operation on the second group in case that the second group is not passed in accordance with the verifying result.

2. The method of claim 1, wherein the step of verifying the first group or the second group is substantially identical to the step of verifying the soft program.

3. The method of claim 1, wherein the step of preprogramming includes:
    applying a program voltage to every word line in the selected block;
    applying a power supply voltage to a drain select line in the selected block;
    applying a voltage of 0V to a source select line in the selected block; and
    programming the selected block.

4. The method of claim 1, wherein the step of performing the erase operation includes:
    applying a voltage of 0V to a word line in the selected block;
    changing a drain select line and a source select line in the selected block into floating state; and
    performing the erase operation by applying a high voltage to a substrate (or well).

5. The method of claim 1, wherein the step of performing the soft program includes:
    applying a program voltage to a word line selected for the soft program in the selected block;
    applying a pass voltage to a word line not selected; and
    applying a power supply voltage to a drain select line in the selected block, providing a voltage of 0V to a source select line, and performing the soft program.

6. The method of claim 1, wherein the step of performing the verifying operation after the soft program includes:
    applying a voltage of 0V to a selected word line in the selected block, wherein the soft program is performed on the selected word line;
    applying a pass voltage to a word line not selected; and
    applying a power supply voltage to a drain select line and a source select line in the selected block, and performing the verifying operation.

7. The method of claim 1, further comprising:
    dividing the first group and the second group into low rank groups; and
    performing a verifying operation on one of the low rank groups, performing a soft program and a verifying operation on the low rank group in case that the low rank group is not passed, and performing a verifying operation, a soft program and a verifying operation on the other low rank group in case that the low rank group is passed.

8. A method of performing an erase operation in a nonvolatile memory device having a memory cell array which includes at least one blocks having multi level cells, the method comprising:
    shifting every threshold voltage distribution into a threshold voltage distribution having highest level by preprogramming every cell in a block selected for erase;
    performing an erase operation on the pre-programmed memory block;
    performing a soft program and a verifying operation on the memory block;
    dividing the memory block into a first group and a second group in case that the memory block is passed in accordance with the verifying result;
    performing a verifying operation on the first group and the second group, and indicating a flag to a group not passed; and
    performing a soft program and a verifying operation on the group to which the flag is indicated.

9. The method of claim 8, wherein the step of verifying the first group and the second group is substantially identical to the step of verifying the soft program.

10. The method of claim 8, wherein the step of preprogramming includes:
    applying a program voltage to every word line in the selected block;

applying a power supply voltage to a drain select line in the selected block;

applying a voltage of 0V to a source select line in the selected block; and programming the selected block.

11. The method of claim 8, wherein the step of performing the erase operation includes:

applying a voltage of 0V to a word line in the selected block;

changing a drain select line and a source select line in the selected block into floating state; and performing the erase operation by applying a high voltage to a substrate (or well).

12. The method of claim 8, wherein the step of performing the soft program includes:

applying a program voltage to a word line in the group to which the flag is indicated;

applying a pass voltage to a word line in the group to which the flag is not indicated; and applying a power supply voltage to a drain select line in the selected block, providing a voltage of 0V to a source select line, and performing the soft program.

13. The method of claim 8, wherein the step of performing the verifying operation after the soft program includes:

applying a voltage of 0V to a word line in a group to which the flag is indicated;

applying a pass voltage to a word line in the group to which the flag is not indicated; and applying a power supply voltage to a drain select line and a source select line in the selected block, and performing the verifying operation.

14. The method of claim 8, further comprising:

dividing the first group and the second group into low rank groups;

performing in sequence a verifying operation on the low rank groups, and indicating a flag to the group not passed; and performing a soft program and a verifying operation on the group to which the flag is indicated.

15. The method of claim 14, further comprising:

removing the flag indication of the group passed in accordance with the verifying result on the soft program.

16. A method of performing an erase operation in a non-volatile memory device, the method comprising:

performing an erase operation on an area of the memory device;

performing a first soft program operation on the area of the memory device;

dividing the area of the memory device into a first group and second group; and performing a second soft program operation on the first group and a third soft program operation on the second group.

17. The method of claim 16, wherein the soft program operation includes:

applying a program voltage to a selected word line; and applying a verify voltage to the selected word line.

* * * * *